United States Patent
Nishide et al.

(12) 
(10) Patent No.: US 6,265,090 B1
(45) Date of Patent: Jul. 24, 2001

(54) ELECTRICALLY CONDUCTIVE PASTE CERAMIC MULTI-LAYERED SUBSTRATE

(75) Inventors: Mitsuyoshi Nishide; Kazuo Kishida, both of Shiga-ken (JP)

(73) Assignee: Murata Maufacturing Co., Ltd. (JP)

( * ) Notice: Subject to any disclaimer, the term of this patent is extended or adjusted under 35 U.S.C. 154(b) by 0 days.

(21) Appl. No.: 09/326,496

(22) Filed: Jun. 4, 1999

(30) Foreign Application Priority Data

Jun. 5, 1998 (JP) .................................................. 10-156956

(51) Int. Cl.[7] ...................................................... B32B 9/00
(52) U.S. Cl. ......................... 428/701; 252/514; 252/500; 501/10; 501/8; 501/19; 501/32; 428/403; 428/702; 428/434
(58) Field of Search ................................. 501/19, 32, 10, 501/8, 4; 428/901, 702, 701, 434, 210, 403; 252/512, 514, 500

(56) References Cited

U.S. PATENT DOCUMENTS 5,468,694 * 11/1995 Taguchi et al. .

6,060,165 * 5/2000 Asada et al. .
6,114,938 * 9/2000 Iida et al. .

FOREIGN PATENT DOCUMENTS 4-043504 * 2/1992 (JP) .
6-334352 * 12/1994 (JP) .

* cited by examiner

*Primary Examiner*—Deborah Jones
*Assistant Examiner*—Wendy Boss
(74) *Attorney, Agent, or Firm*—Ostrolenk, Faber, Gerb & Soffen, LLP

(57) ABSTRACT

Provided is an electrically conductive paste adapted to be sintered at the same time when a ceramic body is being sintered, wherein said paste has a contraction starting temperature that is higher than the contraction ending temperature of said ceramic body during the sintering treatment. Also provided is an electrically conductive paste comprising an electrically conductive component and an organic vehicle component, wherein said electrically conductive component comprises an electrically conductive powder mainly comprising silver, the particles of said electrically conductive powder being coated with a metal oxide having a melting point higher than that of silver.

19 Claims, 1 Drawing Sheet

FIG. 1

ELECTRICALLY CONDUCTIVE PASTE CERAMIC MULTI-LAYERED SUBSTRATE

BACKGROUND OF THE INVENTION

1. Industrial Field of the Invention

The present invention relates to an electrically conductive paste and a ceramic multi-layered substrate formed by using the electrically conductive paste. In particular, this invention relates to an electrically conductive paste and a ceramic multi-layered substrate which can be sintered at a temperature of 1000° C. or lower.

2. Description of the Related Art

A ceramic multi-layered substrate has been used as a circuit substrate when forming an integrated circuit, a high frequency electronic circuit, a hybrid circuit or the like. Usually, a ceramic multi-layered substrate may be obtained by forming within a ceramic body or on the surface thereof either a material layer consisting of an electrically conductive paste or via hole connecting portions, followed by a sintering treatment of the ceramic body. In fact, such a sintering treatment will produce a ceramic sintered body and electrically conductive sintered portions within the ceramic sintered body and/or on the surface thereof.

Such a ceramic multi-layered substrate has been used in various electronic instruments. However, in recent years, in order to meet the demands of high frequency and high speed required by various electronic instruments, the electrically conductive sintered portions of a ceramic multi-layered substrate should be made of a material containing as its main component a low resistance conductor such as silver, gold, or copper. Further, the electrically conductive sintered portions are formed by an electrically conductive paste, and are sintered at the same time when the ceramic body is sintered. For this reason, if the electrically conductive paste contains a low resistance conductor such as silver, gold or copper, a simultaneous sintering treatment can be carried out to simultaneously treat both the ceramic body and the electrically conductive paste. Therefore, the ceramic composition to be contained in the ceramic body can be a glass ceramic capable of being sintered at a relatively low temperature such as a temperature of 1000° C. or lower.

Further, a ceramic multi-layered substrate is usually required not only to have a high density, many functions and high reliability, but also to have high transverse strength against possible breaking. However, since the above glass ceramic capable of being sintered at the same time as the electrically conductive paste containing silver, gold or copper is being sintered often contains a large amount of binder in order to be successfully sintered at a low temperature, the finally formed ceramic body has only a low transverse strength. In order to solve that problem, it has been suggested that some measures be taken to precipitate a kind of crystal during a process of sintering treatment of the above glass ceramic.

On the other hand, the process of manufacturing the above ceramic multi-layered substrate comprises steps of preparing a plurality of green sheets each containing a ceramic composition, printing an electrically conductive paste on to a specific pieces of green sheet, laminating one green sheet upon another so as to form a ceramic body, and sintering the ceramic body. During the sintering treatment, warping and deformation will occur in the thus obtained ceramic multi-layered substrate due to a difference in coefficient of contraction between the green sheets and the electrically conductive paste included in the ceramic body.

In order to solve the above problem, it has been suggested to use a material having only a small coefficient of contraction difference between the green sheets and the electrically conductive paste (such as that disclosed in Japanese Examined Patent Publication No. 3-26554), or to use an electrically conductive paste having a higher contraction ending temperature than a contraction ending temperature of the green sheets (such as that disclosed in Japanese Unexamined Patent Publication No. 2-94595). Further, it has been proved useful to control the particle diameter of metal powder contained in the electrically conductive paste, and to add a kind of frit, different kinds of metals having different melting points and a kind of metal oxide in the electrically conductive paste, thereby to effectively control the contraction of the electrically conductive paste.

When, in order to improve transverse strength of the ceramic sintered body consisting of a low temperature sinterable glass ceramic, a kind of crystal is precipitated in the sintered ceramic body, a severe contraction will occur in the sintered ceramic portions at a temperature near the crystal precipitating temperature. Further, flowability of the glass contained in the ceramic portion will be lost. Because of this, when the ceramic portion undergoes contraction, the electrically conductive paste portions will only contract a little, thus producing a contraction difference between the electrically conductive paste and the ceramic portions. As a result, if these contractions are in a mutually sticking relation, a sort of warping phenomenon will occur, causing an increased deformation in a finally obtained ceramic multi-layered substrate.

Usually when a silver metal powder alone is used as the electrically conductive component in the electrically conductive paste, even if the particle size of the metal powder and its specific surface area are changed, the electrically conductive paste will begin to contract at a temperature of about 300–750° C. As a result, even if the contraction curve is very gentle, when the ceramic portion undergoes a contraction, the electrically conductive paste portions will also begin to contract.

Consequently, as has been disclosed in Japanese Examined Patent Publication No. 3-26554, even if what is used are some specifically selected green sheets and electrically conductive paste, one of which has a contraction coefficient which differs little from that of the other, it is still difficult to prevent deformation of the finally obtained ceramic multi-layered substrate. This problem is caused due to a fact that when the ceramic portion undergoes contraction, the electrically conductive paste portions will also begin to contract, while one of them usually has a contraction curve that is different from that of the other.

On the other hand, when a ceramic material to be used is a glass ceramic containing a large amount of amorphous glass component, the glass will have a high flowability even after the ceramic portion has completed its contraction. As a result, a deformation possibly caused due to the above-mentioned contraction difference will be alleviated due to the flowing of the glass, thus prohibiting warping or deformation in the finally obtained ceramic multi-layered substrate. However, since a glass ceramic containing a large amount of amorphous glass component has a low transverse strength, crystal precipitation is needed in order to obtain a high transverse strength, but when a crystal has been precipitated, the flowability of the glass will become low. As a result, it is difficult to alleviate deformation caused by a contraction difference between the ceramic portions and the electrically conductive paste, making it impossible to avoid warping and deformation in the finally formed ceramic multi-layered substrate.

Even if we can try to use an electrically conductive paste having a higher contraction ending temperature than that of the green sheets, as described in Japanese Unexamined Patent Publication No. 2-94595, contraction of the ceramic portions and contraction of the electrically conductive paste will occur at the same time, with the contraction curves thereof being different from each other, resulting in a deformation caused due to the contraction difference between the two kinds of materials. In fact, such kind of deformation is impossible to be alleviated if a crystal is to be precipitated for obtaining a high transverse strength. Consequently, it is not expected that an effect that the above-mentioned warping or deformation can be alleviated or cured.

Further, if an electrically conductive paste contains a kind of frit, different kinds of metals having different melting points and a kind of metal oxide in an electrically conductive paste, it is possible to effectively control the contraction of the electrically conductive paste. In order for the electrically conductive paste to have a contraction curve which is coincident with that of the ceramic portions, it is necessary to add a large amount of the above substances in the electrically conductive paste. As a result, the electric resistance of the electrically conductive sintered portions obtained by sintering the electrically conductive paste will be decreased. If such a product is used as a ceramic multi-layered substrate to form a high frequency electric circuit, there will be a large conductor loss, hence bring about a deterioration in the performance of the electric circuit.

SUMMARY OF THE INVENTION

To overcome the above described problems, the present invention provides an improved electrically conductive paste and an improved ceramic multi-layered substrate formed by using the electrically conductive paste.

One preferred embodiment of the present invention provides an electrically conductive paste adapted to be sintered at the same time when a ceramic body is being sintered, wherein said paste has a contraction starting temperature that is higher than a contraction ending temperature of said ceramic body during the sintering treatment.

Another preferred embodiment of the present invention provides an electrically conductive paste comprising an electrically conductive component and an organic vehicle component, wherein said electrically conductive component comprises an electrically conductive powder mainly comprising silver, particles of said electrically conductive powder being coated with a metal oxide having a melting point higher than that of silver.

Preferably, the electrically conductive component is in an amount of about 45–90 wt %, the organic component is in an amount of about 10–55 wt %, and the metal oxide is in an amount of about 0.02–1.00 parts by weight with respect to 100 parts by weight of the electrically conductive power. Further, preferably the metal oxide comprises at least one selected from the group consisting of $Al_2O_3$, $ZrO_2$, $TiO_2$, BaO and CaO.

In the above described electrically conductive pastes, the contraction starting temperature during the sintering treatment is preferably 850° C. or higher.

In the above described electrically conductive pastes, preferably the electrically conductive powder comprises silver and at least one selected from the group consisting of platinum, palladium, gold and copper, said at least one being contained in an amount of about 5 parts by weight or less, with respect to 100 parts by weight of silver.

In the above described electrically conductive pastes, preferably the electrically conductive paste is adapted to be sintered at the same time when a ceramic body is being sintered, said ceramic body comprising: a ceramic composition which contains a glass, at least one selected from the group consisting of alumina, mullite, cordierite, forsterite and quartz, a part of the glass being adapted to be crystallized during a sintering treatment.

Yet another preferred embodiment of the present invention provides a ceramic multi-layered substrate comprising a ceramic sintered body and an electrically conductive sintered portion formed within and/or on the ceramic sintered body, wherein the electrically conductive sintered portion is obtainable by sintering the above described electrically conductive paste.

In the above described ceramic multi-layered substrate, the ceramic sintered body may be obtainable by sintering a ceramic composition which comprises glass, quartz, at least one selected from the group consisting of alumina, mullite, cordierite and forsterite, in which a part of the glass being crystallized during a sintering treatment.

Preferably, the ceramic composition comprises about 26–48 wt % of a $CaO—B_2O_3—SiO_2$ glass as its glass component, about 35–68 wt % of at least one selected from the group consisting of alumina, mullite, cordierite and forsterite, about 3–24 wt % of a quartz, 0–about 5 wt % of at least one selected from the group consisting of $Li_2O$, $K_2O$ and $Na_2O$, 0–about 5 wt % of at least one kind of substance selected from the group consisting of $TiO_2$, $ZrO_2$, $CrO_2$ and CuO, in which said ceramic composition a part of said glass component becomes wollastonite during the sintering treatment.

Other features and advantages of the present invention will become apparent from the following description of the invention which refers to the accompanying drawings.

DESCRIPTION OF THE PREFERRED EMBODIMENTS

Figure 1:
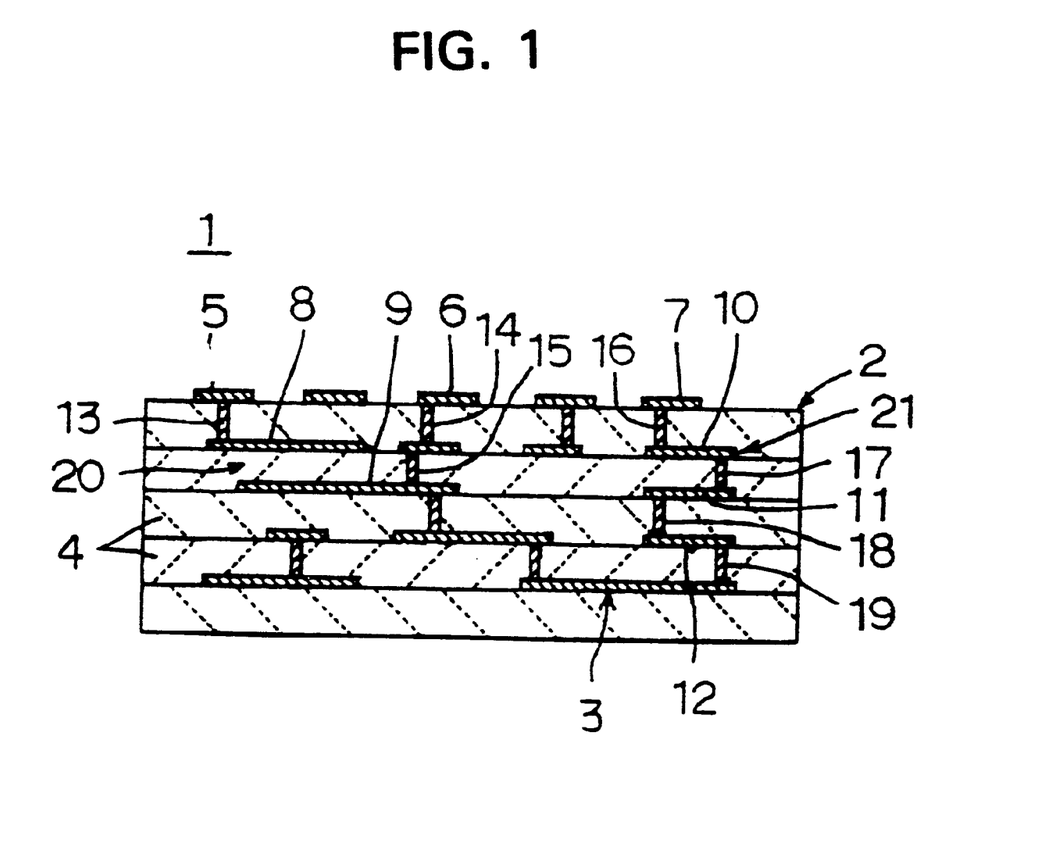
FIG. 1 is a cross sectional view schematically indicating a ceramic multi-layered substrate 1 made according to one preferred embodiment of the present invention.

Referring to FIG. 1, the ceramic multi-layered substrate 1 comprises a ceramic sintered body 2, and electrically conductive sintered portions 3 formed within the ceramic sintered body 2 and/or on the surface thereof.

The ceramic sintered body 2 has a laminated structure obtained by laminating a plurality of green sheets containing a predetermined ceramic composition one upon another to form a laminated ceramic body, followed by a sintering treatment of the laminated ceramic body. Therefore, the ceramic sintered body is comprised of several ceramic layers 4 obtained by sintering a plurality of green sheets.

The electrically conductive sintered portions 3 are formed by sintering an electrically conductive paste at the exactly the same time when the laminated ceramic body is being sintered. In fact, the electrically conductive sintered portions 3 may be formed on the surfaces of the ceramic layers 4, and allowed to be connected to external conductors 5, 6, 7. On the other hand, it is also allowed to provide internal conductors 8, 9, 10, 11, 12 and via hole connecting portions 13, 14, 15, 16, 17, 18, 19 which are all positioned within the ceramic sintered body 2.

The internal conductors 8 and 9 are arranged to face each other with a specific ceramic layer 4 interposed therebetween, thereby forming a condenser section 20.

Further, the via hole connecting portions 16–19 and the internal conductors 10–12 are alternatively and successively connected one by one, so as to form an inductor section 21.

As an electrically conductive paste for forming the electrically conductive sintered portions 3 in the ceramic multi-layered substrate 1, it is preferred to use a material which has a contraction starting temperature that is higher than a contraction ending temperature of the ceramic body which is later to be formed into a ceramic sintered body 2 during the sintering treatment. In this manner, one can substantially prevent warping or deformation possibly occurring in the finally obtained ceramic multi-layered substrate 1. In practice, such an electrically conductive paste contains an electrically conductive component existing in a powder state and an organic vehicle component. In detail, an electrically conductive component may be a sort of an electrically conductive powder which is a silver powder or a metal powder containing silver as its main component.

In order to prevent warping or deformation which will possibly occur during the sintering process of the ceramic multi-layered substrate 1, it is important that when the ceramic body undergoes contraction during the sintering process, the electrically conductive paste will not constrain the ceramic body so that there would be no stress occurring in the ceramic multi-layered substrate 1. For this reason, it is required that the electrically conductive powder contained in the electrically conductive paste be dispersed in a powder state during the contraction process of the ceramic body, thereby ensuring an effect that the powder particles will not start a necking, but such powder necking will start after the contraction of the ceramic body has ended.

As related above, if the contraction starting temperature of the electrically conductive paste is made higher than the contraction ending temperature of the ceramic body, when a contraction stress is caused due to sintering treatment of the electrically conductive paste, the ceramic contained in the ceramic body can be in an already-sintered state. Therefore, a situation will be the same as that in which an electrically conductive paste is sintered on an already-sintered ceramic substrate. As a result, during the sintering treatment of the electrically conductive paste, there will not occur any contraction along the boundary between a ceramic portion and an electrically conductive paste. For example, with regard to the external conductors 5–7 and the internal conductors 8–12, a contraction occurs only in their thickness direction, thereby ensuring a desired tightness or compactness of the laminated structure.

Namely, each ceramic layer 4 of the ceramic body 2 has a larger thickness and a higher bending strength than those of any of the external conductors 5–7 and the internal conductors 8–12. Thus, for the external conductors 5–7 and the internal conductors 8–12, since the electrically conductive paste itself will contract while at the same time alleviating the stress, the stress possibly causing warping or deformation of the ceramic multi-layered substrate 1 will not reach the ceramic layers 4. Further, even in the via hole connecting portions 13–19, the electrically conductive paste may undergo a contraction while at the same time alleviating the stress.

The electrically conductive component contained in the electrically conductive paste, as related earlier in the present specification, comprises an electrically conductive powder consisting of a silver powder or containing the silver powder as its main component. In this way, if a silver powder is used, the finally formed electrically conductive sintered portions 3 can have only a low electric resistance. Further, since the sintering treatment is conducted in an oxidizing atmosphere, the binder contained in the electrically conductive paste may be effectively removed during the sintering treatment. As a result, the entire sintering treatment can be finished with as a short time as possible, thereby permitting the ceramic multi-layered substrate to be manufactured at a reduced low cost.

The particles of the electrically conductive silver powder discussed above can be coated with a metal oxide having a higher melting point than silver. In order to achieve this, an electrically conductive powder is dispersed in a solution of a metal salt, a resinated metal compound or a sol metal compound. Then, upon removing the solvent therefrom, a metal compound will adhere to the surfaces of the particles of the electrically conductive powder. After that, the metal compound coated conductive powder particles are subjected to a heating treatment in air so as to oxidize the metal compound, thereby obtaining a metal oxide.

In this way, since the particles of an electrically conductive silver powder are coated with a metal oxide having a higher melting point than silver, even a small amount of such a metal oxide will effectively delay the necking of the electrically conductive powder. Further, during the sintering treatment, the contraction starting time of an electrically conductive paste may be exactly postponed until after the end of contraction of the ceramic body.

Further, the electrically conductive paste contains about 40–90 wt % of an electrically conductive component and about 10–55 wt % of an organic vehicle component, and preferably does not contain a glass frit. On the other hand, the metal oxide for coating the particles of the electrically conductive powder is preferred to be in an amount of about 0.02–1.00 parts by weight with respect to 100 parts by weight of the electrically conductive powder.

A reason for selecting the above preferred ratio of electrically conductive component to an organic vehicle component may be explained as follows. If the amount of an electrically conductive component is larger than the above ratio, operability of the printing treatment and film slidability during a printing process will become deteriorated. On the other hand, if the amount of organic vehicle component is larger than the above ratio, it will be difficult to obtain a film having a desirably large thickness, and the obtained film will not have a desired compactness. As a result, the electrically conductive sintered portions 3 will have a high electric resistance.

Nevertheless, if the metal oxide for coating the particles of the electrically conductive powder is less than an amount of about 0.02 parts by weight with respect to 100 parts by weight of an electrically conductive powder, there will not be a sufficient effect of delaying its sintering process. On the other hand, if the metal oxide for coating the particles of the electrically conductive powder is more than about 1.00 parts by weight with respect to 100 parts by weight of the electrically conductive powder, the obtained electrically conductive sintered portions 3 will have an increased resistance.

As a metal oxide for coating the particles of the electrically conductive powder, it is preferred to use at least one substance selected from the group consisting of $Al_2O_3$, $ZrO_2$, $TiO_2$, BaO and CaO. Each of these metal oxides has a melting point higher than that silver and has a good reactability with the ceramic layers 4, thereby obtaining a desired effect of inhibiting a delamination or peeling of the electrically conductive sintered portions 3 even after a sintering treatment.

Further, the electrically conductive paste to be used is preferred to have a contraction starting temperature of 850° C. or higher during the sintering treatment. In this way, if the contraction starting temperature is 850° C. or higher, the sintering process of the electrically conductive paste will start after the sintering process of a ceramic body. As a result, the external conductors 5–7 and the internal conductors 8–12 will begin to contract in their thickness direction. Therefore, these internal and external conductors will not receive a constraining force from the electrically conductive paste, thereby obtaining an effect of inhibiting warping or deformation in the finally obtained ceramic multi-layered substrate 1. On the other hand, if the contraction starting temperature of the electrically conductive paste is lower than 850° C., there will be a possibility that the electrically conductive paste can begin its contraction even when the contraction of ceramic portions have not ended. This phenomenon is usually due to a specific composition of a ceramic material forming the ceramic body.

The electrically conductive powder contained in the electrically conductive paste may contain not only silver, but also at least one substance selected from the group consisting of platinum, palladium, gold and copper, with said selected substance being in an amount of about parts by weight or less with respect to 100 parts by weight of a silver. If a selected substance such as a platinum is contained in an amount of about 5 parts by weight or more, there will be a problem that cost for manufacturing an electrically conductive paste will be high and also another problem that the area resistance will be undesirably increased. On the other hand, if copper is used, such copper will usually cause a decrease in the melting point of the silver material. Accordingly, the use of copper is not preferable.

Although there is not any limitation to the average particle size and particle shape of the electrically conductive powder contained in the electrically conductive paste, the average particle size is preferred to be in a range of about 0.5–10 $\mu$m. In particular, it is preferred to avoid large powder particles or an extremely flocculated powder lump, and it is desired that the particles of the electrically conductive powder be formed into shapes which are as close to a spherical shape as possible.

The organic vehicle component contained in the electrically conductive paste may be a mixture obtained by mixing together a binder resin and a solvent, and there is not any limitation to such kind of vehicle component. As a binder resin, it is permitted to use ethylcellulose, an acryl resin, a polyvinyl butyral or a methacryl resin. As a solvent, it is permitted to use terepineol, a butylcarbitol, a butylcarbitol acetate and an alcohol. Further, if necessary, it is also permitted to add some additives such as a dispersing agent, a plasticizer and an activator. In practice, the viscosity of an electrically conductive paste may be selected to be 50–300 Pa.s, so as to obtain a desired operability in the printing treatment.

On the other hand, as a ceramic composition contained in the green sheets forming a plurality of ceramic layers 4, i.e., forming a ceramic body which will later be formed into a ceramic sintered body in the ceramic multi-layered substrate 1, said composition can contain a glass and a filler which is at least one kind of substance selected from the group consisting of alumina, mullite, cordierite and forsterite, also to contain quartz. Further, such a ceramic composition is preferred to be a substance in which a part of glass will be crystallized during a sintering treatment. By using the above-described ceramic composition, one can obtain a desired ceramic multi-layered substrate 1 which has a high transverse strength, a low dielectric constant, a low dielectric loss, and thus is suitable for use as a material appropriate for a high frequency.

Here, a filler which is at least one kind of substance selected from the group consisting of alumina, mullite, cordierite and forsterite, has been proved to have an effect capable of increasing the transverse strength of a finally formed ceramic sintered body, while quartz has been proved to have an effect of reducing the dielectric constant.

Further, a ceramic body consisting of the above ceramic composition contains a glass, a filler selected from the above groups of substances and quartz, and can allow a part of glass to be crystallized during the sintering treatment. Such kind of ceramic body has a contraction starting temperature of 700° C. or higher, and a contraction ending temperature of 850° C. or lower, hence presenting a very acute contraction curve and its contraction starting temperature is relatively high. For this reason, if the particles of electrically conductive silver powder contained in an electrically conductive paste are not coated with a metal oxide having a melting point higher than that of the silver, it would be impossible to delay the sintering process of the electrically conductive paste until after the contracting process of ceramic body has been ended. In view of this, it is important that the particles of electrically conductive silver powder contained in the electrically conductive paste be coated with a metal oxide having a melting point higher than that of the silver, so as to delay the sintering process of the electrically conductive paste until after the contraction process of ceramic body has been ended.

Preferably, the above ceramic composition contains about 26–48 wt % of a $CaO—B_2O_3—SiO_2$ glass serving as its glass component. If such a glass is added in an amount which is less than about 26 wt %, it is impossible to perform a low temperature sintering treatment at a temperature of 1000° C. or lower. On the other hand, if said glass is added in an amount which is more than about 48 wt %, the sintered ceramic body 2 will have too much residual glass which has not been crystallized. As a result, the finally obtained ceramic multi-layered substrate 1 will fail to provide a high transverse strength and is not able to satisfy the requirement of low dielectric loss.

Moreover, a filler component which is at least one kind of substance selected from the group consisting of alumina, mullite, cordierite and forsterite, is preferred to be added in an amount of about 35–68 wt %. If the filler is added in an amount which is less than about 35 wt %, it will be difficult to obtain high transverse strength. On the other hand, if the filler is added in an amount about 68 wt %, it will be difficult to perform a sintering treatment at a low temperature nor is it possible to obtain a low dielectric constant.

The ceramic composition can contain quartz in an amount of about 3–24 wt %. If the quartz is added in an amount that is less than about 3 wt %, the finally obtained ceramic multi-layered substrate 1 will have too high a dielectric constant. On the other hand, if the quartz is added in an amount that is more than about 24 wt %, the finally obtained ceramic multi-layered substrate 1 will fail to offer a sufficiently high transverse strength.

The ceramic composition is also permitted to contain at least one alkali metal oxide selected from the group consisting of $Li_2O$, $K_2O$ and $Na_2O$, so as to lower the melting point of the glass. When the ceramic composition contains such a selected alkali metal oxide, the amount of such an alkali metal oxide should be less than about 5 wt % or less. If an alkali metal oxide is added in an amount which is more than about 5 wt %, the finally obtained sintered ceramic body 2 will undesirably have a high dielectric constant, hence resulting in a large dielectric loss.

Further, the ceramic composition is also permitted to contain at least one metal oxide selected from the group consisting of $TiO_2$, $ZrO_2$, $CrO_2$ and $CuO$, so as to promote the crystallization of the glass. When the ceramic composition contains such a selected metal oxide, the amount of such a metal oxide should be less than about 5 wt % or lower. If a metal oxide is added in an amount which is more than about 5 wt %, the finally obtained sintered ceramic body 2 will contain an amount of residual glass which have not been crystallized, and thus will undesirably have a high dielectric constant, causing the finally obtained ceramic sintered body to have a large dielectric loss.

Further, the ceramic composition is preferred to be crystallized such that during the sintering process a part of the glass will become wollastonite. If the ceramic composition is crystallized so that a part of the glass becomes wollastonite, one can obtain a more satisfactory effect for obtaining an increased transverse strength.

A ceramic body for forming a ceramic sintered body may be formed by laminating a plurality of green sheets which will later be formed into a plurality of ceramic layers 4 one upon another. Such green sheets may be obtained typically using a doctor blade method. Of course, it is also permitted to use other methods such as press molding method or a casting method to form the green sheets.

Table 1 is used to indicate the composition and other properties of an electrically conductive paste prepared according to one preferred embodiment of the present invention.

As indicated in "COMPOSITION" of Table 1, several types of electrically conductive powders consisting of Ag, Ag/Pt, Ag/Pd and Ag/Cu were prepared, and particles of these electrically conductive powders were coated with various different kinds of metal oxides listed in "METAL OXIDE FOR USE AS A COATING" of Table 1. In the "METAL OXIDE FOR USE AS A COATING", the "PARTS BY WEIGHT" represent parts by weight with respect to 100 parts by weight of the electrically conductive powder. Meanwhile, as an organic vehicle, what was used is a mixture obtained by mixing together ethylcellulose and terepineol.

Next, into the electrically conductive powder or the electrically conductive powder coated with a metal oxide, was added an organic vehicle in an amount represented by wt % as indicated in Table 1, thereby obtaining a mixture including these two substances. Then the mixture was stirred and kneaded in a stirring grinder apparatus and a 3-roller machine, thereby obtaining an electrically conductive paste for use as a sample.

Table 2 indicates the compositions of several green sheets made in accordance with this embodiment of the present invention. Further, Table 2 also indicates some properties of the green sheets and some properties of ceramic sintered body containing these green sheets prepared in this embodiment of the present invention.

TABLE 1

| | Electrically conductive paste No. | | 1 | 2 | 3 | 4 | 5 | 6 | 7 | 8 | 9 | 10 |
|---|---|---|---|---|---|---|---|---|---|---|---|---|
| Composition | Electrically conductive powder [wt %] | | Ag 80 | Ag 80 | Ag 80 | Ag 80 | Ag 80 | Ag 80 | Ag 80 | Ag 80 | Ag 45 | Ag 90 |
| | Metal oxide for use as a coating material [parts by weight] | $Al_2O_3$ | 0.02 | 0.1 | 0.5 | 1.0 | 0 | 0 | 0 | 0 | 0.5 | 0.5 |
| | | $ZrO_2$ | 0 | 0 | 0 | 0 | 0.3 | 0 | 0 | 0 | 0 | 0 |
| | | $TiO_2$ | 0 | 0 | 0 | 0 | 0 | 0.3 | 0 | 0 | 0 | 0 |
| | | BaO | 0 | 0 | 0 | 0 | 0 | 0 | 0.3 | 0 | 0 | 0 |
| | | CaO | 0 | 0 | 0 | 0 | 0 | 0 | 0 | 0.3 | 0 | 0 |
| | Organic vehicle [wt %] | | 20 | 20 | 20 | 20 | 20 | 20 | 20 | 20 | 55 | 10 |
| Properties | Contraction starting temperature (° C.) | | 852 | 895 | 915 | 930 | 905 | 895 | 898 | 894 | 911 | 918 |
| | Area resistance (Ω/□) | | 2.1 | 2.3 | 2.6 | 3.1 | 2.5 | 2.4 | 2.4 | 2.4 | 2.8 | 2.7 |
| | Substrate Sheet used | No. 4 No. 12 | 40 30 | 25 20 | 10 5 | 5 5 | 25 20 | 20 15 | 20 15 | 20 15 | 10 5 | 10 10 |
| | warping [μm] | | | | | | | | | | | |

| | Electrically conductive paste No. | | 11 | 12 | 13 | 14 | 15 | 16 | 17 | 18 | 19 | 20 |
|---|---|---|---|---|---|---|---|---|---|---|---|---|
| Composition | Electrically conductive powder [wt %] | | 95Ag/ 5Pd 80 | 95Ag/ 5Pt 80 | 95Ag/ 5Au 80 | 95Ag/ 5Cu 80 | Ag 80 | Ag 80 | Ag 80 | Ag 80 | Ag 40 | Ag 92 |
| | Metal oxide for use as a coating material [parts by weight] | $Al_2O_3$ | 0.30 | 0.30 | 0.30 | 0.01 | 0 | 0.01 | 2.0 | 0 | 0.5 | 0.5 |
| | | $ZrO_2$ | 0 | 0 | 0 | 0 | 0 | 0 | 0 | 2.0 | 0 | 0 |
| | | $TiO_2$ | 0 | 0 | 0 | 0 | 0 | 0 | 0 | 0 | 0 | 0 |
| | | BaO | 0 | 0 | 0 | 0 | 0 | 0 | 0 | 0 | 0 | 0 |
| | | CaO | 0 | 0 | 0 | 0 | 0 | 0 | 0 | 0 | 0 | 0 |
| | Organic vehicle [wt %] | | 20 | 20 | 20 | 20 | 20 | 20 | 20 | 20 | 60 | 8 |
| Properties | Contraction starting temperature (° C.) | | 913 | 915 | 908 | 907 | 560 | 780 | 960 | 963 | 910 | 920 |
| | Area resistance (Ω/□) | | 3.2 | 3.1 | 2.9 | 2.7 | 2.0 | 2.1 | 5.0 | 5.1 | 10 | 2.5 |
| | Substrate Sheet used | No. 4 No. 12 | 5 5 | 5 5 | 5 5 | 10 10 | 260 230 | 130 50 | 20 5 | 20 5 | 10 5 | 10 5 |
| | warping [μm] | | | | | | | | | | | |

TABLE 2

| Green sheet No. | | 1 | 2 | 3 | 4 | 5 | 6 | 7 |
|---|---|---|---|---|---|---|---|---|
| Composition | Glass [wt %] | 30 | 45 | 40 | 42.5 | 35 | 45 | 40 |
| | Filler Alumina | 60 | 40 | 55 | 50 | 45 | 40 | 45 |
| | [wt %] Mullite | 0 | 0 | 0 | 0 | 0 | 10 | 0 |
| | Cordierite | 0 | 0 | 0 | 0 | 0 | 0 | 10 |
| | Forsterite | 0 | 0 | 0 | 0 | 0 | 0 | 0 |
| | Total | 60 | 40 | 55 | 50 | 45 | 50 | 55 |
| | Quarts [wt %] | 10 | 15 | 5 | 7.5 | 20 | 5 | 5 |
| Properties | Sintering temperature (° C.) | 940 | 860 | 900 | 880 | 920 | 860 | 900 |
| | Crystalline phase | A, W, S | A, W, S | A, W, S | A, W, S | A, W, S | A, W, S, M | A, W, S, C |
| | Transverse strength [MPa] | 330 | 280 | 310 | 300 | 260 | 270 | 290 |
| | Specific dielectric constant (1 MHz) | 7.8 | 6.5 | 7.0 | 6.8 | 6.0 | 6.7 | 6.8 |
| | Q (1 MHz) | 3500 | 2500 | 4000 | 3000 | 2100 | 2300 | 2300 |

| Green sheet No. | | 8 | 9 | 10 | 11 | 12 | 13 | 14 |
|---|---|---|---|---|---|---|---|---|
| Composition | Glass [wt %] | 42.5 | 45 | 40 | 25 | 55 | 30 | 50 |
| | Filler Alumina | 40 | 20 | 25 | 60 | 40 | 40 | 50 |
| | [wt %] Mullite | 0 | 30 | 0 | 0 | 0 | 0 | 0 |
| | Cordierite | 0 | 0 | 0 | 5 | 0 | 0 | 0 |
| | Forsterite | 10 | 0 | 30 | 0 | 0 | 0 | 0 |
| | Total | 50 | 50 | 55 | 65 | 40 | 40 | 50 |
| | Quarts [wt %] | 7.5 | 5 | 5 | 10 | 5 | 30 | 0 |
| Properties | Sintering temperature (° C.) | 880 | 860 | 900 | 1100 | 820 | 950 | 850 |
| | Crystalline phase | A, W, S, F | A, W, S, M | A, W, S, F | — | A, W, S | A, W, S | A, W |
| | Transverse strength [MPa] | 280 | 250 | 240 | — | 200 | 200 | 300 |
| | Specific dielectric constant (1 MHz) | 6.5 | 6.3 | 6.2 | — | 7.5 | 5.5 | 8.2 |
| | Q (1 MHz) | 2700 | 2100 | 2200 | — | 2000 | 1800 | 2600 |

The components of the glass indicated in "COMPOSITION" of Table 2, such as oxides, carbonates or hydroxides, were mixed together to form a starting material in a manner such that a weight ratio of $CaO/B_2O_3/SiO_2/Al_2O_3=40/10/45/5$ can be established. Then, the obtained starting material was put into a platinum crucible and melted at a temperature of 1550° C. for about 1 hour. Subsequently, the molten glass was rapidly cooled and ground in a ball mill so as to obtain a glass powder.

The glass powder obtained in the above process was mixed with a filler and quartz in a weight relationship represented by wt % indicated in Table 2, thereby obtaining an intermediate mixture. Then, a solvent, a binder and a plasticizer were added in the mixture and were mixed. Subsequently, a doctor blade method was used so as to produce several green sheets for use as various samples.

Referring again to Table 1, "PROPERTIES", "CONTRACTION STARTING TEMPERATURE", "AREA RESISTANCE" and "SUBSTRATE WARPING" are indicated here. These properties were evaluated with the use of the following methods.

"CONTRACTION STARTING TEMPERATURE" was measured in the following manner. Each electrically conductive paste for use as a sample was dried at a temperature of 150° C. for 10 minutes so as to obtain a dried powder. The obtained dried powder particles were then passed through a 200 mesh sieve and said powder particles were put into a metal mould. After that, a pressure which is as large as that for pressing a plurality of laminated green sheets during the process of manufacturing a ceramic multi-layered substrate was applied to the metal mould, thereby forming a cylindrical bulk having a diameter of 6 mm and a height of 3 mm. Subsequently, the bulk was baked in an air atmosphere with the baking temperature rising at a speed of 20° C./min. At the same time, the dimensional variation in its height direction was measured with the use of a TMA (thermo mechanical analysis) method, thereby obtaining a temperature at which the bulk starts to contract, and thus obtaining a desired contraction starting temperature.

"AREA RESISTANCE" was measured in the following manner. Each electrically conductive paste was printed on to the No. 4 green sheet shown in Table 2 in a manner such that upon a sintering treatment, the paste will become a piece of a member having a width of 500 µm, a length of 5 mm and a thickness of 10 µm. Then, the electrically conductive paste and the green sheets are sintered at the same moment so as to obtain a sample. In this way, the area resistance may be measured by measuring the area resistance of an electrically conductive sintered portion obtained by the sintering treatment of the electrically conductive paste.

"SUBSTRATE WARPING" was measured in the following manner. A green sheet of No. 4 and a green sheet of No. 12 were laminated together in a manner such that a laminated body after sintering treatment will have a size of 51 mm×51 mm×0.8 mm. Then, on one surface of thus obtained laminated body, an electrically conductive paste was printed in a manner such that the total surface area of the electrodes will be 50% of the total area of the one surface of the laminated body. Afterwards, the electrically conductive paste and the green sheet No. 4 were sintered at a temperature of 880° C., and the electrically conductive paste and the green sheet No. 12 were sintered at a temperature of 820° C., thereby obtaining desired samples. In this way, the data concerning substrate warping may be obtained by evaluating these samples.

As can be understood from "SINTERING TEMPERATURE" shown in "PROPERTIES" of Table 2, the sintering temperatures, i.e., the contraction ending temperatures of green sheet No. 4 and green sheet No. 12 are respectively 880° C. and 820° C. An electrically conductive paste having a contraction starting temperature lower than a contraction ending temperature of a green sheet, as shown in the cases of No. 15 and No. 16, presents an extremely large "SUBSTRATE WARPING". It may be understood from this fact that if "SUBSTRATE WARPING" is needed to be controlled, the electrically conductive paste is required to have a contraction starting temperature higher than a contraction ending temperature of a green sheet.

In regard to the contraction starting temperature of the above electrically conductive pastes, as may be understood from a comparison between Nos. 1–14, Nos. 17–20 and No. 15, if the particles of an electrically conductive powder contained in the electrically conductive paste are coated by a metal oxide, one is allowed to raise the contraction starting temperature, i.e., allowed to delay the sintering process.

However, as in a case of an electrically conductive paste of No. 16, it is understood that if a metal oxide for coating the particles of an electrically conductive powder is added only in an amount of 0.01 parts by weight, which is less than 0.02 parts by weight, with respect to 100 parts by weight of an electrically conductive powder, it will be difficult to obtain a sufficient effect of raising a contraction starting temperature, i.e., it will be difficult to delay the sintering process of the electrically conductive paste. Further, as in the cases of No. 17 and No. 18 electrically conductive pastes, if a metal oxide for coating the particles of an electrically conductive powder is added in an amount of 2.0 parts by weight, which is larger than 1.0 parts by weight, area resistance will become high.

For this reason, a metal oxide is preferred to be added in an amount of about 0.02–1.00 parts by weight with respect to 100 parts by weight of an electrically conductive powder.

Further, with regard to an electrically conductive paste of No. 19 shown in Table 1, the organic vehicle is added in an amount of 60 wt % which is larger than 55 wt %. As a result, an appropriate viscosity is difficult to obtain and some problems will occur in a printing treatment. In addition, since it is impossible to obtain a film having a sufficient thickness, the finally obtained film will not have a desired compactness and area resistance will be high.

On the other hand, in electrically conductive paste of No. 20, the organic vehicle is contained in an amount of 8 wt %, which is less than 10 wt %. Even under such a circumstance, an appropriate viscosity is still difficult to obtain, some problems will occur in printing operation and the finally obtained film will have an deteriorated slidability.

In view of the above, an electrically conductive paste is preferred to contain about 45–90 wt % of electrically conductive powder and about 10–55 wt % of organic vehicle.

"TRANSVERSE STRENGTH" listed as "PROPERTY" in Table 2 may be measured in the following manner. A plurality of green sheets were laminated one upon another and then were treated in a sintering treatment. Subsequently, the bending strength of 3 points were measured in accordance with Japan Industrial Standard (JIS R1601), thereby obtaining data concerning transverse strength, which are the transverse strengths obtained by measuring a substrate having a size of 36 mm×4 mm×3 mm.

Further, a ceramic multi-layered substrate 1 as shown in FIG. 1 was prepared. Here, as a plurality of green sheets forming the ceramic layers 4, used were the various green sheets listed in Table 2. Further, for use as the external conductors 5–7 and the internal conductors 8–12, and for use as an electrically conductive paste for forming the electrically conductive sintered portions 3 including via hole connecting portions 13–19, used was the electrically conductive paste No. 1 listed in Table 1. Further, in order to sinter these green sheets and the electrically conductive paste, these two different kinds of substances were sintered simultaneously at a "SINTERING TEMPERATURE" i.e., a contraction ending temperature.

A frequency of 1 MHz was applied to a position between the external conductor 5 and the external conductor 6 on each ceramic multi-layered substrate 1 obtained in the above-discussed manner. Then, static capacity of a condenser section 20 and frequency Q were measured so as to calculate a specific dielectric constant. Such "SPECIFIC DIELECTRIC CONSTANT" and "Q" are shown in Table 2.

In Table 2, "CRYSTALLINE PHASE" means a crystalline phase formed after the sintering treatment. Such a crystalline phase was determined by analysing the ceramic layer 4 of the ceramic multi-layered substrate 1 obtained in the above-described method with the use of X-ray diffraction. In Table 2, A is used to represent alumina, W is used to represent wollastonite, S is used to represent quartz, M is used to represent mullite, C is used to represent cordierite and F is used to represent forsterite.

As may be understood from Table 2, if green sheets of No. 1–No. 10 are used, can obtain the following excellent properties, i.e., transverse strength will be 240–330 MPa, specific dielectric constant will be 6.0–7.8, and Q will be 2100–4000.

On the other hand, with a green sheet of No. 11, if a glass component is added in an amount of 25 wt %, which is an amount less than 26 wt %, the temperature necessary for sintering treatment will be 1100° C. In fact, the sintering process failed to occur at a temperature of 1000° C.

Further, when using a green sheet of No. 12, a glass component was added in an amount of 55 wt %, which is an amount larger than 48 wt %. As a result, the transverse strength became as low as 200 MPa.

Moreover, when using a green sheet of No. 13, a quartz component was added in an amount of 30 wt %, which is an amount larger than 24 wt %. As a result, a transverse strength and Q become low.

Further, when using a green sheet of No. 14, since a quartz component was added in an amount of 0 wt %, which is less than 3 wt %, the specific dielectric constant had become as high as 8.2, i.e., the specific dielectric constant failed to be lowered to a value that is less than 8.

As is understood from the above data, the green sheets of No. 1–No. 10 have been proved to be acceptable examples, i.e., it would be preferred that a glass component be added in an amount of about 26–48 wt %, quartz be added in an amount of about 3–24 wt % and filler be added in an amount of about 35–68 wt %.

As described in the above, with the use of an electrically conductive paste made according to the present invention, one can prevent any possible stress from constraining a contraction of the ceramic body, which contraction is usually caused in a sintering treatment where the ceramic body and the electrically conductive paste are sintered simultaneously since during the sintering treatment, said paste has a contraction starting temperature that is higher than a contraction ending temperature of a ceramic body. Therefore, one can prevent a sintered ceramic body from warping or deforming.

Further, as to an electrically conductive paste made according to the present invention, since said electrically conductive component contains an electrically conductive powder consisting of a metal which is silver or which contains silver as its main component, one can reduce electric resistance of each electrically conductive sintered portion formed by the sintering treatment, and it becomes possible to perform a predetermined sintering treatment in an oxidizing atmosphere. As a result, the process of removing a binder may be performed effectively, thereby enabling the sintering treatment to be completed in a reduced short time.

Moreover, as to an electrically conductive paste made according to the present invention, since particles of said electrically conductive powder consisting of a metal which is silver or contains the silver as its main component have been coated with a metal oxide having a melting point higher than that of the silver, it is possible to raise the necking starting temperature of the electrically conductive powder during the sintering treatment, thereby effectively raising the contraction starting temperature of the electrically conductive paste.

In addition, with an electrically conductive paste made according to the present invention, if said electrically conductive component is contained in an amount of about 45–90 wt % and said organic vehicle component is contained in an amount of about 10–55 wt %, one can perform a desired printing treatment and reduce electric resistance of each electrically conductive sintered portion formed by the sintering treatment.

Further, if said metal oxide for coating the particles of the electrically conductive powder is contained in an amount of about 0.02–1.00 parts by weight with respect to 100 parts by weight of the electrically conductive powder, one can obtain the effect that a sintering process of the electrically conductive paste may be delayed, thereby effectively preventing an undesired rising of electric resistance of each electrically conductive sintered portion formed by the sintering treatment.

Moreover, if said metal oxide for coating the particles of the electrically conductive powder is at least one substance selected from the group consisting of $Al_2O_3$, $ZrO_2$, $TiO_2$, BaO and CaO, it is sure for the electrically conductive powder to obtain a good reactivity with the ceramic portions, thereby rendering it possible to prevent a problem of delamination or peeling which will possibly occur in a ceramic multi-layered substrate after a sintering treatment.

In addition, if during the sintering treatment of the electrically conductive paste of the present invention, said contraction starting temperature is set to be 850° C. or higher, the contraction starting temperature of the electrically conductive paste may be made higher than the contracting ending temperature of the ceramic body, with such an effect being obtainable within a large range of composition of the ceramic component contained in the ceramic body which is to be sintered at the same time when the electrically conductive paste is being sintered. Therefore, one can obtain a high transverse strength, a low dielectric constant, and a high frequency Q. For instance, it is possible to simultaneously sinter both the electrically conductive paste and the ceramic body, the later of which contains about 26–48 wt % of a $CaO$—$B_2O_3$—$SiO_2$ glass as its glass component, about 35–68 wt % of at least one kind of substance selected from the group consisting of alumina, mullite, cordierite and forsterite, about 3–24 wt % of quartz, 0–about 5 wt % of at least one substance selected from the group consisting of $Li_2O$, $K_2O$ and $Na_2O$, and 0–about 5 wt % of at least one kind of substance selected from the group consisting of $TiO_2$, $ZrO_2$, $CrO_2$ and CuO, and during a sintering treatment said ceramic composition can be crystallized such that a part of said glass component will become wollastonite.

In this way, with the use of the electrically conductive paste made according to the present invention, since it is possible to simultaneously sinter both the ceramic body and the electrically conductive paste, one can provide an improved ceramic multi-layered substrate comprising a ceramic sintered body and electrically conductive sintered portions formed within the ceramic sintered body and/or on the surface of the ceramic sintered body.

In the ceramic multi-layered substrate made according to the present invention, if said ceramic body is obtained by sintering ceramic compositions which contain a glass, at least one substance selected from the group consisting of alumina, mullite, cordierite, forsterite and quartz, and in which a part of the glass will be crystallized during a sintering treatment, one can obtain the following effects. Namely, it has become possible to manufacture a ceramic multi-layered substrate without any trouble such as warping or deformation, thereby enabling a finally obtained ceramic multi-layered substrate to have high strength, a low dielectric constant and a high frequency Q.

In particular, the above ceramic composition contains about 26–48 wt % of a $CaO$—$B_2O_3$—$SiO_2$ glass as its glass component, about 35–68 wt % of at least one kind of substance selected from the group consisting of alumina, mullite, cordierite and forsterite, about 3–24 wt % of a quartz, 0–about 5 wt % of at least one substance selected from the group consisting of $Li_2O$, $K_2O$ and $Na_2O$, and 0–about 5 wt % of at least one kind of substance selected from the group consisting of $TiO_2$, $ZrO_2$, $CrO_2$ and CuO, and during a sintering treatment, said ceramic composition can be crystallized such that a part of said glass component will become wollastonite. Therefore, one can enable a finally obtained ceramic multi-layered substrate to have a high strength, a low dielectric constant and a high frequency Q.

While the invention has been particularly shown and described with reference to preferred embodiments thereof, it will be understood by those skilled in the art that the forgoing and other changes in form and details may be made therein without departing from the spirit of the invention.

What is claimed is:

1. An electrically conductive paste adapted to be sintered at the same time when a ceramic body is being sintered, wherein said paste has a viscosity of 50–300 Pa.s and has a contraction starting temperature of at least 850° C. and which is higher than the contraction ending temperature of said ceramic body during a sintering treatment.

2. An electrically conductive paste adapted to be subjected to a sintering treatment when a ceramic body is being sintered, comprising an electrically conductive component and an organic vehicle, wherein said electrically conductive component comprises an electrically conductive powder comprising silver particles coated with a oxide having a melting point higher than that of silver.

3. An electrically conductive paste according to claim 2, wherein said electrically conductive component is about 45–90 wt % and said organic component is about 10–55 wt % of said paste, and wherein said metal oxide is about 0.02–1 parts by weight with respect to 100 parts by weight of said electrically conductive power.

4. An electrically conductive paste according to claim 3, wherein said metal oxide comprises at least one member selected from the group consisting of $Al_2O_3$, $ZrO_2$, $TiO_2$, BaO and CaO.

5. An electrically conductive paste according to claim 4 having a contraction starting temperature during the sintering treatment of 850° C. or higher.

6. An electrically conductive paste according to claim 5, wherein said electrically conductive powder comprises silver and about 5 parts by weight or less with respect to 100 parts by weight of silver of at least one member selected from the group consisting of platinum, palladium, gold and copper.

7. An electrically conductive paste according to claim 2, wherein said electrically conductive powder comprises silver and about 5 parts by weight or less with respect to 100 parts by weight of silver of at least one member selected from the group consisting of platinum, palladium, gold and copper.

8. An electrically conductive paste according to claim 2 having a contraction starting temperature during the sintering treatment of 850° C. or higher.

9. A green sheet for use in forming a multi-layered substrate comprising an electrically conductive paste according to claim 2 disposed on a ceramic body, said ceramic body comprising a glass which partly crystallizes during a sintering treatment, at least one member selected from the group consisting of alumina, mullite, cordierite, forsterite, and quartz, and wherein said paste has a contraction starting temperature that is higher than the contraction ending temperature of said ceramic body during a sintering treatment.

10. A green sheet according to claim 9, wherein said electrically conductive paste comprising an electrically conductive component and an organic vehicle, wherein said electrically conductive component comprises an electrically conductive powder comprising silver particles coated with a metal oxide having a melting point higher than that of silver, and wherein said ceramic comprises about 26–48 wt % of a CaO—$B_2O_3$—$SiO_2$ glass, about 35–68 wt % of at least one member selected from the group consisting of alumina, mullite, cordierite and forsterite, about 3–24 wt % of quartz, 0–about 5 wt % of at least one member selected from the group consisting of $Li_2O$, $K_2O$ and $Na_2O$, and 0–about 5 wt % of at least one substance selected from the group consisting of $TiO_2$, $ZrO_2$, $CrO_2$ and CuO.

11. A green sheet according to claim 10, wherein said electrically conductive paste has a contraction starting temperature during a sintering treatment of 850° C. or higher and said ceramic has a contraction ending temperature during the sintering treatment below 850° C.

12. A green sheet according to claim 10, wherein said electrically conductive powder comprises silver and about 5 parts by weight or less with respect to 100 parts by weight of silver of at least one member selected from the group consisting of platinum, palladium, gold and copper.

13. A ceramic multi-layered substrate comprising a sintered ceramic body comprising a plurality of layers, and a sintered electrically conductive portion within or on the ceramic sintered body or both, wherein said sintered electrically conductive portion is the sintered electrically conductive paste of claim 2.

14. The ceramic multi-layered substrate according to claim 13, wherein said sintered ceramic body comprises glass, quartz, and at least one member selected from the group consisting of alumina, mullite, cordierite and forsterite, and wherein a part of the glass was crystallized during the sintering treatment.

15. The ceramic multi-layered substrate according to claim 14, wherein said sintered ceramic body comprises about 26–48 wt % of a wollastonite-containing CaO—$B_2O_3$—$SiO_2$ glass, about 35–68 wt % of at least one member selected from the group consisting of alumina, mullite, cordierite and forsterite, about 3–24 wt % of quartz, 0–about 5 wt % of at least one member selected from the group consisting of $Li_2O$, $K_2O$ and $Na_2O$, and 0–about 5 wt % of at least one substance selected from the group consisting of $TiO_2$, $ZrO_2$, $CrO_2$ and CuO.

16. The ceramic multi-layered substrate according to claim 15, wherein said sintered electrically conductive portion comprises an electrically conductive powder comprising silver particles coated with a metal oxide having a melting point higher than that of silver.

17. The ceramic multi-layered substrate according to claim 16, wherein said metal oxide is about 0.02–1 parts by weight with respect to 100 parts by weight of said electrically conductive power and is at least one member selected from the group consisting of $Al_2O_3$, $ZrO_2$, $TiO_2$, BaO and CaO.

18. The ceramic multi-layered substrate according to claim 17, wherein said electrically conductive powder comprises silver and about 5 parts by weight or less with respect to 100 parts by weight of silver of at least one member selected from the group consisting of platinum, palladium, gold and copper.

19. An electrically conductive paste according to claim 8 having a viscosity of 50–300 Pa.s and wherein the contraction starting temperature is higher than the contraction ending temperature of said ceramic body during a sintering treatment.

* * * * *